(12) United States Patent
Yokoyama et al.

(10) Patent No.: US 11,469,377 B2
(45) Date of Patent: Oct. 11, 2022

(54) COMPOSITION, ORGANIC PHOTOELECTRONIC ELEMENT, AND PRODUCTION METHODS THEREFOR

(71) Applicants: NATIONAL UNIVERSITY CORPORATION YAMAGATA UNIVERSITY, Yamagata (JP); AGC Inc., Chiyoda-ku (JP)

(72) Inventors: Daisuke Yokoyama, Yonezawa (JP); Takefumi Abe, Chiyoda-ku (JP); Yasuhiro Kuwana, Chiyoda-ku (JP)

(73) Assignees: NATIONAL UNIVERSITY CORPORATION YAMAGATA UNIVERSITY, Yamagata (JP); AGC Inc., Chiyoda-ku (JP)

( * ) Notice: Subject to any disclaimer, the term of this patent is extended or adjusted under 35 U.S.C. 154(b) by 435 days.

(21) Appl. No.: 16/449,574

(22) Filed: Jun. 24, 2019

(65) Prior Publication Data
US 2019/0312202 A1    Oct. 10, 2019

(30) Foreign Application Priority Data

Feb. 8, 2017 (JP) .............................. JP2017-021388
Aug. 24, 2017 (JP) .............................. JP2017-161637

(51) Int. Cl.
*H01L 51/50* (2006.01)
*H01L 51/00* (2006.01)
(Continued)

(52) U.S. Cl.
CPC ............ *H01L 51/004* (2013.01); *C08F 14/20* (2013.01); *C08F 36/20* (2013.01); *H01L 51/50* (2013.01);
(Continued)

(58) Field of Classification Search
None
See application file for complete search history.

(56) References Cited

U.S. PATENT DOCUMENTS

| 2004/0265630 A1* | 12/2004 | Suh ...................... H01L 51/506 428/690 |
| 2006/0289843 A1* | 12/2006 | Hsu ...................... C08G 61/124 252/518.1 |

(Continued)

FOREIGN PATENT DOCUMENTS

| JP | 2006-237083 | 9/2006 |
| JP | 2007-141736 | 6/2007 |

(Continued)

OTHER PUBLICATIONS

U.S. Appl. No. 16/431,113, filed Jun. 4, 2019, Daisuke Yokoyama, et al.

(Continued)

*Primary Examiner* — Gregory D Clark
(74) *Attorney, Agent, or Firm* — Oblon, McClelland, Maier & Neustadt, L.L.P.

(57) ABSTRACT

To provide a composition having a very low refractive index, an organic photoelectronic element using the composition, and simple methods for producing such a composition and an organic photoelectronic element.

A composition comprising a fluorinated polymer, an organic semiconductor material and a dopant.

13 Claims, 1 Drawing Sheet

(51) Int. Cl.
*C08F 14/20* (2006.01)
*C08F 36/20* (2006.01)
*H05B 33/10* (2006.01)

(52) U.S. Cl.
CPC ......... *H01L 51/5024* (2013.01); *H05B 33/10* (2013.01)

(56) References Cited

U.S. PATENT DOCUMENTS

| | | |
|---|---|---|
| 2007/0114919 A1 | 5/2007 | Sotoyama |
| 2016/0005972 A1 | 1/2016 | Otani |
| 2016/0248017 A1 | 8/2016 | Otani |
| 2019/0305226 A1* | 10/2019 | Yokoyama .............. C08L 27/18 |

FOREIGN PATENT DOCUMENTS

| | | |
|---|---|---|
| WO | WO 2014/132917 A1 | 9/2014 |
| WO | WO 2015/050057 A1 | 4/2015 |
| WO | WO 2015/146957 A1 | 10/2015 |
| WO | WO 2016/043084 A1 | 3/2016 |
| WO | WO 2016/100313 A1 | 6/2016 |
| WO | WO 2016/136425 A1 | 9/2016 |
| WO | WO 2016/204275 A1 | 12/2016 |
| WO | WO 2019/039563 A1 | 2/2019 |
| WO | WO 2019/039564 A1 | 2/2019 |

OTHER PUBLICATIONS

International Search Report dated May 15, 2018 in PCT/JP2018/003835, filed on Feb. 5, 2018.

Saxena, K. et al. "A review on the light extraction techniques in organic electroluminescent devices", Optical Materials 32, 2009, pp. 221-233.

Walzer, K. et al. "Highly Efficient Organic Devices Based on Electrically Doped Transport Layers", Chemical Review vol. 107, No. 4, 2007, pp. 1233-1271.

Yokoyama, D. "Molecular orientation in small-molecule organic light-emitting diodes", Journal of Materials Chemistry, 21, 2011, pp. 19187-19202.

* cited by examiner

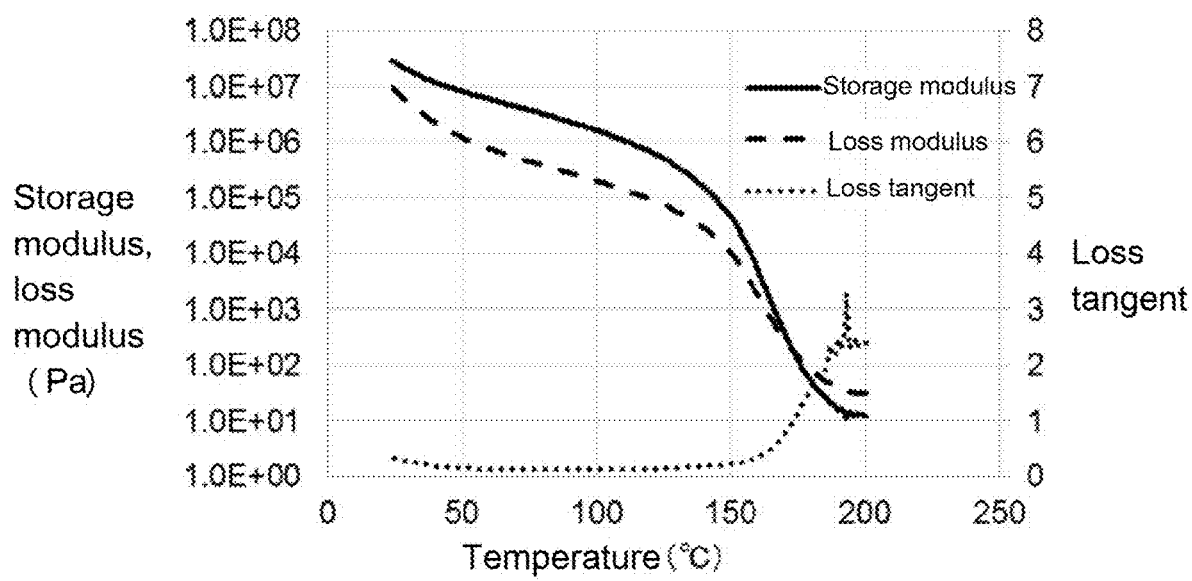

COMPOSITION, ORGANIC PHOTOELECTRONIC ELEMENT, AND PRODUCTION METHODS THEREFOR

TECHNICAL FIELD

The present invention relates to a composition, an organic photoelectronic element, and production methods therefor.

BACKGROUND ART

Of an organic photoelectronic element such as an organic electroluminescence element (hereinafter referred to as "organic EL device"), the internal quantum efficiency has already reached almost 100%, and in order to further improve the external quantum efficiency, an improvement of the light-extraction efficiency is desired. The light-extraction efficiency of an organic EL device remains usually at a level of from 20 to 30%, and its improvement is greatly expected. To improve the light-extraction efficiency, for example, a technique to impart a very fine microlens to the substrate surface, a technique to microfabricate the substrate surface, a technique to use a high refractive index substrate, and a technique to let a scattering substance be present between a transparent substrate and a transparent electrode, etc., have been known (Patent Document 1 and Non-Patent Document 1).

On the other hand, as a means to improve the electrical conductivity of a charge transport layer of an organic semiconductor device such as an organic EL device, a method of mixing an additive called a dopant in an organic semiconductor material which is a material of e.g. the charge transport layer has been known. Non-Patent Document 2 discloses that a binary charge transport layer containing an organic semiconductor material and a dopant may have an electrical conductivity higher than a unitary charge transport layer containing no dopant and containing an organic semiconductor material.

PRIOR ART DOCUMENTS

Patent Document

Patent Document 1: WO2016/043084

Non-Patent Documents

Non-Patent Document 1: K. Saxena et al., Opt. Mater. 32(1), 221-233, (2009)
Non-Patent Document 2: K. Walzer et al., Chem. Rev. 107(4), 1233-1271, (2007)
Non-Patent Document 3: D. Yokoyama, J. Mater. Chem. 21, 19187-19202 (2011)

DISCLOSURE OF INVENTION

Technical Problem

However, both the techniques disclosed in Patent Document 1 and Non-Patent Document 1 require an expensive member or complicate an element preparation process and thereby remarkably increase the production cost. As a means not to increase the production cost, a technique to make use of horizontal orientation property of light-emitting molecules in an organic EL device thereby to improve the light-extraction efficiency by several tens percent has been known (Non-Patent Document 3), however, the light-extraction efficiency should still be improved.

Non-Patent Document 2 failed to conduct studies on the improvement of the light-extraction efficiency at all.

The essential reason of the low light-extraction efficiency of e.g. an organic EL device is a high refractive index of an organic semiconductor material constituting an emissive layer and a charge transport layer. If the refractive index on the light-emitting side is high, light is lost by total reflection or the like at an interface having a different refractive index, whereby the light-extraction efficiency is lowered. An organic semiconductor material mainly used for an organic EL device has a refractive index (from about 1.7 to about 1.8) lower than that of an inorganic semiconductor commonly used for an LED, however, the light-extraction efficiency still remains at the above value. Accordingly, it has been strongly desired to use an organic semiconductor material having a further lower refractive index.

However, it is difficult to realize a charge transport layer having a sufficiently low refractive index only by selecting the organic semiconductor material, and an effective technique to remarkably lower the refractive index of the charge transport layer without impairing the basic performance of the charge transport layer has not been realized at all.

Under these circumstances, it is an object of the present invention to provide a charge transport layer having a very low refractive index while keeping basic performance of a charge transport layer, an organic photoelectronic element using the charge transport layer, and simple methods for producing such a charge transport layer and an organic photoelectronic element.

Solution to Problem

The present invention provides the following.
[1] A composition comprising a fluorinated polymer, an organic semiconductor material and a dopant.
[2] The composition according to [1], wherein the fluorinated polymer has a refractive index in a wavelength range of from 450 nm to 800 nm of at most 1.5.
[3] The composition according to [1] or [2], wherein the fluorinated polymer is a fluorinated polymer having an alicyclic ring in its main chain.
[4] The composition according to any one of [1] to [3], wherein the fluorinated polymer has a mass average molecular weight of from 1,500 to 50,000. [5] The composition according to any one of [1] to [4], wherein the fluorinated polymer has a saturated vapor pressure at 300° C. of at least 0.001 Pa.
[6] The composition according to any one of [1] to [5], wherein the proportion of the fluorinated polymer is from 30 to 70 vol % to the total amount of the fluorinated polymer, the organic semiconductor material and the dopant.
[7] The composition according to any one of [1] to [6], wherein the proportion of the dopant is from 10 to 200 parts by mole per 100 parts by mole of the total amount of substance of the organic semiconductor material.
[8] The composition according to any one of [1] to [7], which has a surface roughness of at most 1.0 nm by RMS.
[9] The composition according to any one of [1] to [8], which has an absorption coefficient in a wavelength range of from 450 nm to 800 nm of at most 5,000 $cm^{-1}$.
[10] The composition according to any one of [1] to [9], which has a refractive index in a wavelength range of from 450 nm to 800 nm of at most 1.60.

[11] An organic photoelectronic element having a layer comprising the composition as defined in any one of [1] to [10].

[12] The organic photoelectronic element according to [11], wherein the organic photoelectronic element is an organic EL device.

[13] A method for producing a layer comprising the composition as defined in any one of [1] to [10], which comprises co-depositing the fluorinated polymer, the organic semiconductor material and the dopant.

[14] A method for producing the organic photoelectronic element as defined in [11] or [12], which comprises co-depositing the fluorinated polymer, the organic semiconductor material and the dopant.

Advantageous Effects of Invention

According to the present invention, it is possible to provide a composition having a very low refractive index, an organic photoelectronic element using the composition, and simple methods for producing a layer comprising the composition and an organic photoelectronic element.

When a layer containing a composition having a very low refractive index is used for an organic EL device, the light-extraction efficiency improves, and such is effective to improve the brightness and to decrease the driving voltage of the element. Further, by decrease and control of the refractive index, it is possible to suppress light reflection by decreasing differences in the refractive index at an interface between organic films, at an interface between an organic film and a substrate and at an interface between an organic film and the air, and it is possible to suppress light reflection by disposing an antireflection layer having a refractive index in the middle at the above interface.

Accordingly, when a technique to control the refractive index of the layer containing the composition of the present invention is used for a light-receiving element, the light-extraction efficiency can be improved, and when used for a transistor, light transmission property (transparency) can be improved.

BRIEF DESCRIPTION OF DRAWINGS

FIG. 1 is a graph illustrating the relation between the elastic modulus and the temperature of polymer K used in Examples.

DESCRIPTION OF EMBODIMENTS

The composition of the present invention comprises a fluorinated polymer, an organic semiconductor material and a dopant.

The fluorine atom content in the fluorinated polymer in the present invention is preferably from 20 to 77 mass %, more preferably from 30 to 70 mass %, particularly preferably from 40 to 70 mass %. When the fluorine atom content is within the above range, the refractive index of the charge transport layer tends to be low.

The fluorine atom content (mass %) is obtained from the following formula.

(Fluorine atom content)=[19×$N_F$/$M_A$]×100

$N_F$: The sum of values each obtained by multiplying the number of fluorine atoms in each type of units constituting the fluorinated polymer and the mole fraction of the units to all the units.

$M_A$: The sum of values each obtained by multiplying the total of atomic weights of all atoms constituting each type of units constituting the fluorinated polymer and the mole fraction of the units to all the units.

Further, the fluorine atom content is a value measured by $^1$H-NMR or elemental analysis. It may be calculated also from the amounts of charge of monomers and an initiator used for producing the fluorinated polymer.

From the viewpoint of the rate of formation of the layer such as a charge transport layer, and the strength and the surface roughness of the layer, the fluorinated polymer preferably has a saturated vapor pressure sufficient to be practically used at a temperature at which the heat decomposition of the fluorinated polymer occurs or lower. The thermal decomposition starting temperature of PTFE which is a common fluorinated polymer is about 400° C., and the heat decomposition starting temperature of Teflon (registered trademark) AF is 350° C. The saturated vapor pressure of the fluorinated polymer of the present invention at 300° C. is preferably at least 0.001 Pa, preferably at least 0.002 Pa. From such a viewpoint, the fluorinated polymer is preferably a fluorinated polymer having low crystallinity, more preferably a perfluorinated polymer which is considered to have small intermolecular interaction of the polymer.

In the present invention, the "saturated vapor pressure" (unit: Pa) is a value measured by vacuum thermovalance (manufactured by ADVANCE RIKO, Inc., VPE-9000).

In addition to the saturated vapor pressure, as a parameter of evaporability of the fluorinated polymer, the evaporation rate may be employed. The evaporability of the fluorinated polymer having a saturated vapor pressure at 300° C. of at least 0.001 Pa corresponds to an evaporation rate at 300° C. at a degree of vacuum of 0.001 Pa of at least 0.01 g/m$^2$·sec.

The mass average molecular weight (hereinafter referred to as Mw) of the fluorinated polymer is preferably from 1,500 to 50,000, more preferably from 3,000 to 40,000, further preferably from 5,000 to 30,000. When Mw is at least 1,500, the deposited film to be formed tends to have sufficient strength. On the other hand, when Mw is at most 50,000, such a fluorinated polymer has a saturated vapor pressure which imparts practical deposited film forming rate (film deposition rate), and accordingly it is not necessary to heat the deposition source to high temperature, specifically a temperature higher than 400° C. If the temperature of the deposition source is too high, the main chain of the fluorinated polymer will cleave in the deposition step, the fluorinated polymer tends to have a low molecular weight, and the deposited film to be formed tends to have insufficient strength and further defects derived from decomposed products will form, whereby a smooth surface is hardly obtained. Further, unintentionally included molecules or ions formed by cleavage of the main chain may influence the electrical conductivity of the film, and in such a case, it may be difficult to control the electrical conductivity of the deposited film.

Accordingly, when Mw is within a range of from 1,500 to 50,000, a deposited film having sufficient strength and a smooth surface will be formed without cleavage of the main chain of the fluorinated polymer. In an organic EL element, the surface roughness of a deposited film such as a charge transport layer is an important factor, and when the deposited film has a smooth surface, charge transport at the interface will be smoothly conducted, and problems such as leak current, device defects, and a decrease of electricity efficiency can be avoided.

In the present invention, the mass average molecular weight (Mw) and the after-described number average molecular weight (hereinafter referred to as "Mn") are values measured by gel permeation chromatography (GPC).

From the viewpoint of the stability of the quality of the deposited film to be formed, the dispersity (Mw/Mn) of the fluorinated polymer is preferably low, and is preferably at most 2. The theoretical lower limit of the dispersity is 1. In order to obtain a fluorinated polymer having a low dispersity, a method of conducting controlled polymerization such as living radical polymerization, a molecular weight fractionation purification method by size exclusion chromatography or a molecular weight fractionation purification method by sublimation purification may be mentioned. Among these methods, considering the stability of the deposition rate, sublimation purification is preferred.

The "dispersity" of the fluorinated polymer means a proportion of Mw to Mn (number average molecular weight), that is, Mw/Mn. Hereinafter, the dispersity will be referred to as "Mw/Mn". In this specification, Mw and Mn are values measured by gel permeation chromatography (GPC). Mw/Mn is a value calculated from the obtained Mw and Mn.

Further, the glass transition point (Tg) of the fluorinated polymer is preferably high, whereby the reliability of the obtainable element will be high. Specifically, the glass transition point is preferably at least 60° C., more preferably at least 80° C., particularly preferably at least 100° C. The upper limit is not particularly limited and is preferably 350° C., more preferably 300° C.

In a case where the fluorinated polymer is formed into a film by deposition, the film obtained is formed by polymer molecules differing in the molecular weight as between the initial stage and the terminal stage of the deposition, due to such properties that polymer molecules having a lower molecular weight start evaporating first. In deposition, the thickness of the deposited film to be formed is controlled usually by opening and closing of e.g. a shutter placed immediately above the deposition source, and on that occasion, the molecular weight fractionation is conducted at the same time, and Mw and Mw/Mn are different between the polymer as the deposition source and the polymer in the deposited film formed.

In the present invention, Mw of the fluorinated polymer in the deposited film is preferably from 1,000 to 20,000, more preferably from 1,500 to 15,000, further preferably from 2,000 to 10,000. When Mw is at least 1,000, the deposited film will be excellent in strength and heat resistance. On the other hand, when Mw is at most 20,000, the electrical conductivity of the charge transport layer can be maintained.

Further, from the viewpoint of homogeneity of the deposited film, Mw/Mn of the fluorinated polymer in the deposited film is preferably at most 1.2, more preferably at most 1.1. When Mw/Mn is at most 1.2, the proportion of the low molecular weight polymer contained in the deposited film is low, and the deposited film will be excellent in heat resistance and have high homogeneity. Mw/Mn being at least 1.3 means a high proportion of an extremely low molecular weight polymer contained in the deposited film, and the deposited film will be inferior in heat resistance and have uneven film structure.

The upper limit of the refractive index of the fluorinated polymer at a wavelength of from 450 nm to 800 nm is preferably 1.5, more preferably 1.4, particularly preferably 1.35. When the refractive index of the fluorinated polymer at a wavelength of from 450 nm to 800 nm is at most the above upper limit value, the refractive index of the layer such as a charge transport layer can be effectively decreased with a smaller mixing amount, and the light-extraction efficiency of an organic EL device to be obtained can be improved without impairing the electrical conductivity of the layer such as a charge transport layer. The theoretical lower limit value of the refractive index of the fluorinated polymer is 1.0.

The present inventors have paid attention to the fact that the essential reason of the low light-extraction efficiency of a conventional organic EL device resides in high refractive indices of the emissive layer, the charge transport layer and the like of the conventional organic EL device. The refractive index of a conventional charge transport layer used for an organic EL device is at a level of from 1.7 to 1.8 at a center wavelength of light emission of the device, which is low as compared with an inorganic semiconductor used for an LED which had been practically used, but the light-extraction efficiency still remains at a level of from 20 to 30%. It is considered that in a conventional organic EL device having a charge transport layer or the like constituted by such an organic semiconductor, light loss occurs by total reflection at an interface between the charge transport layer or the like and an adjacent layer such as a glass substrate, whereby the light-extraction efficiency becomes low.

More specifically, the refractive index of soda glass constituting the layer of a glass substrate is at a level of from 1.51 to 1.53, and the refractive index of quartz glass is at a level of from 1.46 to 1.47. When the refractive index of the layer such as a charge transport layer is lowered to a level of 1.5 which is at the same level as the refractive index of the layer of a glass substrate and the difference in the refractive index between them becomes small, total reflection which occurs at an interface between the charge transport layer and the glass substrate can be avoided, and the light-extraction efficiency will improve.

Accordingly, when the upper limit value of the refractive index of the fluorinated polymer is 1.5, the refractive index of the charge transport layer is likely to be lowered to the same level as the refractive index of the glass substrate or the like, and the light-extraction efficiency is likely to improve.

As a fluorinated polymer, the following polymers (1) and (2) may be mentioned.

Polymer (1): a fluorinated polymer having no alicyclic ring in its main chain and having units derived from a fluoroolefin (hereinafter sometimes referred to as "fluoroolefin units").

Polymer (2): a fluorinated polymer having an alicyclic ring in its main chain.

<<Polymer (1)>>

The polymer (1) may be a homopolymer of a fluoroolefin, or may be a copolymer of a fluoroolefin and other monomer copolymerizable with the fluoroolefin.

The fluoroolefin may, for example, be tetrafluoroethylene, hexafluoropropylene, chlorotrifluoroethylene, vinylidene fluoride, vinyl fluoride, perfluoroalkylethylene (e.g. one having a $C_{1-10}$ perfluoroalkyl group) or trifluoroethylene.

Among them, preferred is tetrafluoroethylene or hexafluoropropylene, in which all hydrogen atoms bonded to carbon atoms are substituted by fluorine, whereby the refractive index of the charge transport layer is likely to be lowered.

Other monomer copolymerizable with the fluoroolefin may, for example, be a vinyl ether, a vinyl ester, an aromatic vinyl compound, an allyl compound, an acryloyl compound or a methacryloyl compound.

In a case where the polymer (1) is a copolymer, the proportion of the units derived from the fluoroolefin is preferably at least 20 mol %, more preferably at least 40 mol %, further preferably at least 80 mol %

As the polymer (1), a polymer synthesized may be used, or a commercial product may be used.

As the polymer (1), the following fluorinated polymers may be mentioned.

Polytetrafluoroethylene (PTFE), a tetrafluoroethylene/perfluoro(alkyl vinyl ether) copolymer (PFA), a tetrafluoroethylene/hexafluoropropylene copolymer (FEP), a tetrafluoroethylene/perfluoro(alkyl vinyl ether)/hexafluoropropylene copolymer (EPA), an ethylene/tetrafluoroethylene copolymer (ETFE), polyvinylidene fluoride (PVDF), polyvinyl fluoride (PVF), polychlorotrifluoroethylene (PCTFE), an ethylene/chlorotrifluoroethylene copolymer (ECTFE), etc.

Among them, preferred is polytetrafluoroethylene (PTFE), a tetrafluoroethylene/perfluoro(alkyl vinyl ether) copolymer (PFA), a tetrafluoroethylene/hexafluoropropylene copolymer (FEP) or a tetrafluoroethylene/perfluoro(alkyl vinyl ether)/hexafluoropropylene copolymer (EPA), in which all hydrogen atoms bonded to carbon atoms are substituted by fluorine, whereby the refractive index of the charge transport layer is likely to be lowered.

The polymer (1) may be produced by a known method.

As the polymer (1), a polymer synthesized may be used, or a commercial product may be used.

<<Polymer (2)>>

The polymer (2) is a fluorinated polymer having an alicyclic ring in its main chain.

The "fluorinated polymer having an alicyclic ring structure in its main chain" means a fluorinated polymer having units having an alicyclic ring structure, at least one carbon atom constituting the alicyclic ring being a carbon atom constituting the main chain. The alicyclic ring may be a ring having a hetero atom such as an oxygen atom.

The "main chain" of a polymer means, in the case of a polymer of a monoene having a polymerizable double bond, a chain of carbon atoms derived from the two carbon atoms constituting the polymerizable double bond, and in the case of a polymer formed by cyclopolymerization of a cyclopolymerizable diene, a chain of carbon atoms derived from the four carbon atoms constituting the two polymerizable double bonds. In a copolymer of the monoene and the cyclopolymerizable diene, the main chain is constituted by the two carbon atoms of the monoene and the four carbon atoms of the diene.

Accordingly, a polymer of a monoene having an alicyclic ring is a polymer of a monoene having a structure such that one carbon atom constituting the ring skeleton of the alicyclic ring or two adjacent carbon atoms constituting the ring skeleton are a carbon atom constituting the polymerizable double bond. In the case of a polymer formed by cyclopolymerization of a cyclopolymerizable diene, as described hereinafter, two to four among four carbon atoms constituting the two double bonds are carbon atoms constituting the alicyclic ring.

The number of atoms constituting the ring skeleton of the alicyclic ring in the polymer (2) is preferably from 4 to 7, particularly preferably from 5 to 6. That is, the alicyclic ring is preferably a 4- to 7-membered ring, particularly preferably a 5- to 6-membered ring. In a case where the alicyclic ring has a hetero atom as an atom constituting the ring, the hetero atom may, for example, be an oxygen atom or a nitrogen atom, preferably an oxygen atom. Further, the number of such a hetero atom constituting the ring is preferably from 1 to 3, more preferably 1 or 2.

The alicyclic ring may have a substituent, or may not have a substituent. "May have a substituent" means that a substituent may be bonded to an atom constituting the ring skeleton of the alicyclic ring.

The hydrogen atom bonded to a carbon atom constituting the alicyclic ring of the polymer (2) is preferably substituted by a fluorine atom. Further, in a case where the alicyclic ring has a substituent, and the substituent has a hydrogen atom bonded to a carbon atom, such a hydrogen atom is preferably substituted by a fluorine atom. The substituent having a fluorine atom may, for example, be a perfluoroalkyl group, a perfluoroalkoxy group or $=CF_2$.

The alicyclic ring in the polymer (2) is preferably a perfluoroalicyclic ring (an alicyclic ring in which all the hydrogen atoms bonded to carbon atoms, including substituents, are substituted by a fluorine atom), whereby the refractive index of the charge transport layer is likely to be lowered.

As the polymer (2), the following polymers (21) and (22) may be mentioned. Polymer (21): a fluorinated polymer having units derived from a fluorinated cyclic monoene.

Polymer (22): a fluorinated polymer having units formed by cyclopolymerization of a cyclopolymerizable fluorinated diene (hereinafter sometimes referred to simply as "fluorinated diene").

Polymer (21):

A "fluorinated cyclic monoene" is a fluorinated monomer having one polymerizable double bond between carbon atoms constituting an alicyclic ring, or a fluorinated monomer having one polymerizable double bond between a carbon atom constituting an alicyclic ring and a carbon atom out of the alicyclic ring.

As the fluorinated cyclic monoene, the following compound (1) or (2) is preferred.

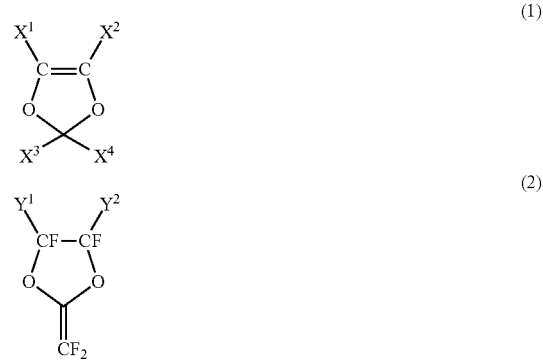

wherein $X^1$, $X^2$, $X^3$, $X^4$, $Y^1$ and $Y^2$ are each independently a fluorine atom, a perfluoroalkyl group which may contain an etheric oxygen atom (—O—) or a perfluoroalkoxy group which may contain an etheric oxygen atom, and $X^3$ and $X^4$ may be mutually bonded to form a ring.

The perfluoroalkyl group as each of $X^1$, $X^2$, $X^3$, $X^4$, $Y^1$ and $Y^2$ has preferably from 1 to 7 carbon atoms, particularly preferably from 1 to 4 carbon atoms. The perfluoroalkyl group is preferably linear or branched, particularly preferably linear. It may, for example, be specifically a trifluoromethyl group, a pentafluoroethyl group or a heptafluoropropyl group, and is particularly preferably a trifluoromethyl group.

The perfluoroalkoxy group as each of $X^1$, $X^2$, $X^3$, $X^4$, $Y^1$ and $Y^2$ may be one having an oxygen atom (—O—) bonded to the perfluoroalkyl group, particularly preferably a trifluoromethoxy group.

In the formula (1), $X^1$ is preferably a fluorine atom.

$X^2$ is preferably a fluorine atom, a trifluoromethyl group or a 1-4 perfluoroalkoxy group, particularly preferably a fluorine atom or a trifluoromethoxy group.

$X^3$ and $X^4$ are each independently preferably a fluorine atom or a 01-4 perfluoroalkyl group, particularly preferably a fluorine atom or a trifluoromethyl group.

$X^3$ and $X^4$ may be mutually bonded to form a ring. The number of atoms constituting the ring skeleton of the ring is preferably from 4 to 7, particularly preferably from 5 to 6.

As specific examples of the preferred compound (1), compounds (1-1) to (1-5) may be mentioned.

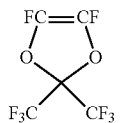

(1-1)

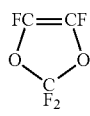

(1-2)

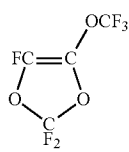

(1-3)

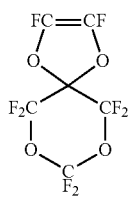

(1-4)

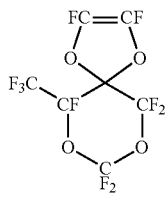

(1-5)

In the formula (2), $Y^1$ and $Y^2$ are each independently preferably a fluorine atom, a $C_{1-4}$ perfluoroalkyl group or a $C_{1-4}$ perfluoroalkoxy group, particularly preferably a fluorine atom or a trifluoromethyl group.

As specific examples of the preferred compound (2), compounds (2-1) and (2-2) may be mentioned.

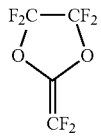

(2-1)

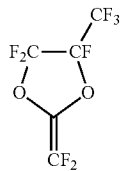

(2-2)

The polymer (21) may be a homopolymer of the above fluorinated cyclic monoene, or may be a copolymer of the fluorinated cyclic monoene and other copolymerizable monomer.

However, the proportion of the units derived from the fluorinated cyclic monoene to all the units in the polymer (21) is preferably at least 20 mol %, more preferably at least 40 mol %, further preferably 100 mol %.

Other monomer copolymerizable with the fluorinated cyclic monoene may, for example, be a fluorinated diene, a monomer having a reactive functional group in its side chain, tetrafluoroethylene, chlorotrifluoroethylene or perfluoro(methyl vinyl ether). As the fluorinated diene, the same diene as mentioned for the above-described polymer (22) may be mentioned. The monomer having a reactive functional group in its side chain may be a monomer having a polymerizable double bond and a reactive functional group. The polymerizable double bond may, for example, be $CF_2$=CF—, $CF_2$=CH—, $CH_2$=CF—, CFH=CF—, CFH=CH—, $CF_2$=C— or CF=CF—. As the reactive functional group, the same functional group as mentioned for the after-described polymer (22) may be mentioned.

The polymer obtained by copolymerization of the fluorinated cyclic monoene and the fluorinated diene is regarded as the polymer (21).

Polymer (22):

A "fluorinated diene" is a cyclopolymerizable fluorinated monomer having two polymerizable double bonds and a fluorine atom. The polymerizable double bond is preferably a vinyl group, an allyl group, an acryloyl group or a methacryloyl group. As the fluorinated diene, the following compound (3) is preferred.

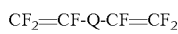

$CF_2$=CF-Q-CF=$CF_2$  (3)

In the formula (3), Q is a $C_{1-5}$, preferably $C_{1-3}$ perfluoroalkylene group which may be branched, which may contain an etheric oxygen atom, and in which one or more fluorine atoms may be substituted by a halogen atom other than fluorine atom. The halogen atom other than fluorine may, for example, be a chlorine atom or a bromine atom.

Q is preferably a perfluoroalkylene group containing an etheric oxygen atom. In such a case, the etheric oxygen atom in the perfluoroalkylene group may be present at one terminal of the group, may be present at both terminals of the group, or may be present between carbon atoms of the group. In view of cyclopolymerizability, it is present preferably at one terminal of the group.

As specific examples of the compound (3), the following compounds may be mentioned.

$CF_2$=CFOCF$_2$CF=CF$_2$, $CF_2$=CFOCF(CF$_3$)CF=CF$_2$, $CF_2$=CFOCF$_2$CF$_2$CF=CF$_2$, $CF_2$=CFOCF$_2$CF(CF$_3$)CF=CF$_2$, $CF_2$=CFOCF(CF$_3$)CF$_2$CF=CF$_2$, $CF_2$=CFOCFClCF$_2$CF=CF$_2$, $CF_2$=CFOCCl$_2$CF$_2$CF=CF$_2$, $CF_2$=CFOCF$_2$OCF=CF$_2$, $CF_2$=CFOC(CF$_3$)$_2$OCF=CF$_2$, $CF_2$=CFOCF$_2$CF(OCF$_3$)CF=CF$_2$, $CF_2$=CFCF$_2$CF=CF$_2$, $CF_2$=CFCF$_2$CF$_2$CF=CF$_2$, $CF_2$=CFCF$_2$OCF$_2$CF=CF$_2$.

As units formed by cyclopolymerization of the compound (3), the following units (3-1) to (3-4) may, for example, be mentioned.

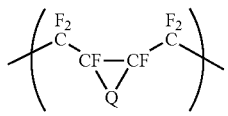
(3-1)

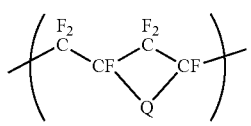
(3-2)

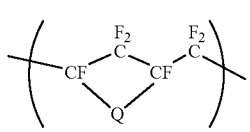
(3-3)

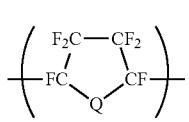
(3-4)

The polymer (22) may be a homopolymer of the fluorinated diene, or may be a copolymer with other monomer copolymerizable with the fluorinated diene.

Other monomer copolymerizable with the fluorinated diene may, for example, be a monomer having a reactive functional group in its side chain, tetrafluoroethylene, chlorotrifluoroethylene or perfluoro(methyl vinyl ether).

The polymer (22) may, for example, be specifically a polymer represented by the following formula (3-1-1), obtained by cyclopolymerization of $CF_2=CFOCF_2CF_2CF=CF_2$ (perfluoro(3-butenyl vinyl ether)).

Hereinafter, perfluoro(3-butenyl vinyl ether) will be referred to as "BVE".

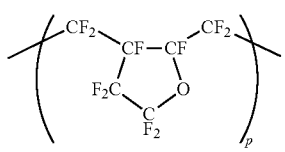
(3-1-1)

In the formula (3-1-1), p is an integer of from 1 to 1,000.

p is preferably an integer of from 5 to 800, particularly preferably an integer of from 10 to 500.

The polymer (2) may have or may not have a reactive functional group, and it preferably has no reactive functional group. The reactive functional group is, in view of easiness of introduction into the polymer and the reactivity, preferably at least one member selected from the group consisting of a carboxy group, an acid halide group, an alkoxycarbonyl group, a carbonyloxy group, a carbonate group, a sulfo group, a phosphono group, a hydroxy group, a thiol group, a silanol group and an alkoxysilyl group, particularly preferably a carboxy group or an alkoxycarbonyl group.

The reactive functional group may be bonded to the terminal of the main chain of the polymer (2) or may be bonded to a side chain. In view of easiness of production, it is preferably bonded to the terminal of the main chain. That is, the polymer (2) according to a preferred embodiment has an alkoxycarbonyl group at the terminal of the main chain.

As the polymer (2), a polymer synthesized may be used, or a commercial product may be used.

The polymer (2) may, for example, be specifically a BVE cyclic polymer (manufactured by Asahi Glass Company, Limited, CYTOP (registered trademark)), a tetrafluoroethylene/2,2,4-trifluoro-5-trifluoromethoxy 1,3-dioxole copolymer (manufactured by Solvay, Hyflon (registered trademark) AD), or a tetrafluoroethylene/perfluorodimethyldioxole copolymer (manufactured by Chemours (former DuPont), Teflon (registered trademark) AF). Among them, preferred is a BVE cyclic polymer (manufactured by Asahi Glass Company, Limited, CYTOP (registered trademark) or a tetrafluoroethylene/perfluorodimethyldioxole copolymer (manufactured by Chemours (former DuPont), Teflon (registered trademark) AF), having an alicyclic ring in its main chain.

In the present invention, the fluorinated polymer is preferably the polymer (2), more preferably the polymer (22), particularly preferably a fluorinated polymer represented by the formula (3-1-1), obtained by cyclopolymerization of BVE.

In a case where the fluorinated polymer is the polymer (2), its Mw is preferably from 1,500 to 50,000, more preferably from 3,000 to 40,000, further preferably from 5,000 to 30,000. When Mw is at least 1,500, the strength of the layer such as the charge transport layer is excellent. On the other hand, when Mw is at most 50,000, excellent film-forming property will be obtained. More specifically, a polymer (2) having Mw of at most 50,000 has a saturated vapor pressure which gives a practical film-forming rate, and accordingly it is not necessary to heat the deposition source to high temperature, specifically a temperature higher than 400° C. If the temperature of the deposition source is too high, the main chain of the polymer (2) will cleave in the deposition step, the fluorinated polymer tends to have a low molecular weight, and the layer such as the charge transport layer to be formed tends to have insufficient strength and further defects derived from decomposed products will form, whereby a smooth surface is hardly obtained. Further, unintentionally included molecules or ions formed by cleavage of the main chain may influence the electrical conductivity of the layer such as the charge transport layer, and in such a case, it may be difficult to control the electrical conductivity of the layer such as the charge transport layer.

Accordingly, when Mw is within a range of from 1,500 to 50,000, a film having sufficient strength and a smooth surface will be obtained without cleavage of the main chain of the polymer (2).

In a case where the fluorinated polymer is the polymer (2), it has an intrinsic viscosity [η] of preferably from 0.01 to 0.14 dl/g, more preferably from 0.02 to 0.1 dl/g, particularly preferably from 0.02 to 0.08 dl/g. When [η] is at least 0.01 dl/g, the molecular weight of the fluorinated polymer is relatively high, and the charge transport layer after formation tends to have sufficient strength. On the other hand, when [η] is at most 0.14 dl/g, the molecular weight of the fluorinated polymer is relatively low, and such a fluorinated polymer will have a saturated vapor pressure which gives a practical film deposition rate.

The "intrinsic viscosity [η] (unit: dl/g)" is a value measured by an Ubbelohde viscometer (manufactured by SHIBATA SCIENTIFIC TECHNOLOGY LTD., viscometer Ubbelohde) at a measurement temperature of 30° C. using ASAHIKLIN (registered trademark) AC2000 (manufactured by Asahi Glass Company, Limited) as a solvent.

In the present invention, as the fluorinated polymer, either one of the polymers (1) and (2) may be used, or both the polymers (1) and (2) may be used in combination. The organic semiconductor material of the present invention is an organic compound material having semiconductive electrical characteristics.

The organic semiconductor material may be a hole transport material which transports holes injected from the anode side and an electron transport material which transports electrons injected from the cathode side. Both are suitably used in the present invention, and the hole transport material is preferred as the organic semiconductor material of the present invention.

As the hole transport material, an aromatic amine derivative is suitably exemplified. As its specific examples, α-NPD, PDA, TAPC, TPD, m-MTDATA, N-(diphenyl-4-yl)-9,9-dimethyl-N-(4-(9-phenyl-9H-carbazol-3yl)phenyl)-9H-fluorene-2-amine (hereinafter referred to as "HT211"), HTM081 (manufactured by Merck), HTM163 (manufactured by Merck), HTM222 (manufactured by Merck), NHT-5 (manufactured by Novaled), NHT-18 (manufactured by Novaled), NHT-49 (manufactured by Novaled) and NHT-51 (manufactured by Novaled), but the hole transport material is not limited thereto.

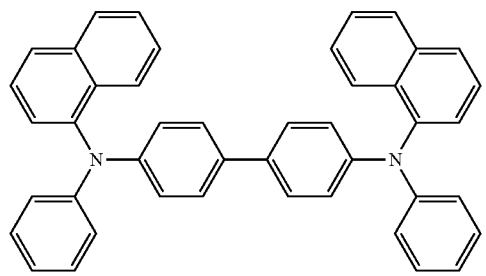

α-NPD

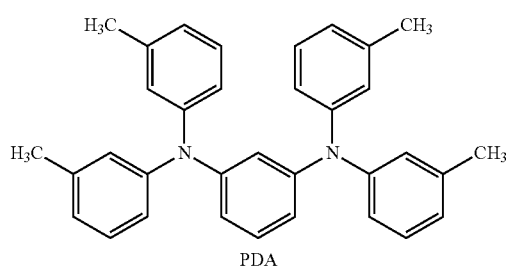

PDA

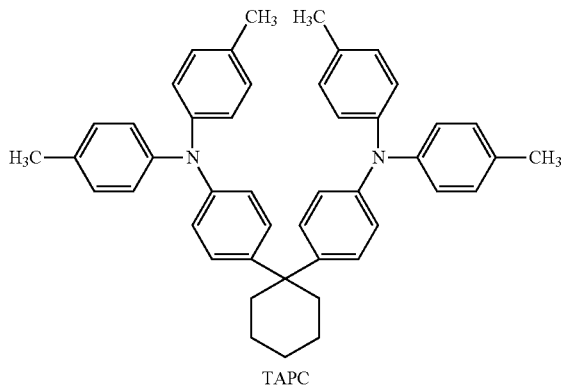

TAPC

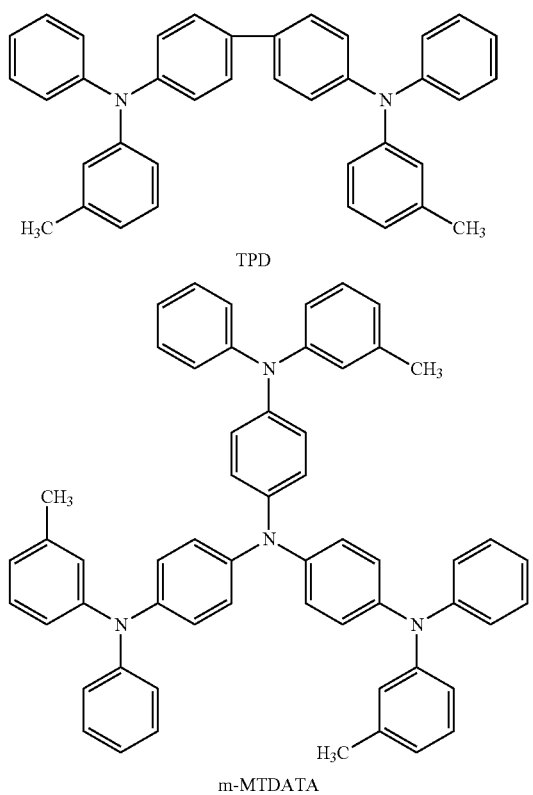

TPD m-MTDATA

As the electron transport material, a nitrogen-containing heterocyclic ring derivative may preferably be mentioned. As its specific examples, Alq3, PBD, BND, TAZ, OXD-7, NET-5 (manufactured by Novaled), NET-8 (manufactured by Novaled), NET-18 (manufactured by Novaled), and TR-E314 (manufactured by TORAY INDUSTRIES, INC), but the electron transport material is not limited thereto.

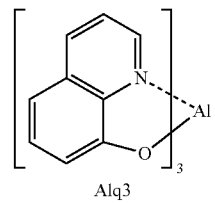

Alq3

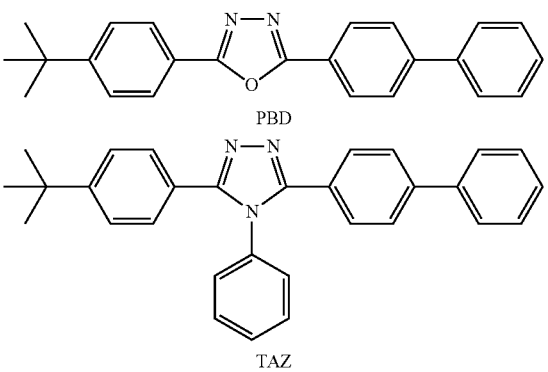

PBD

TAZ

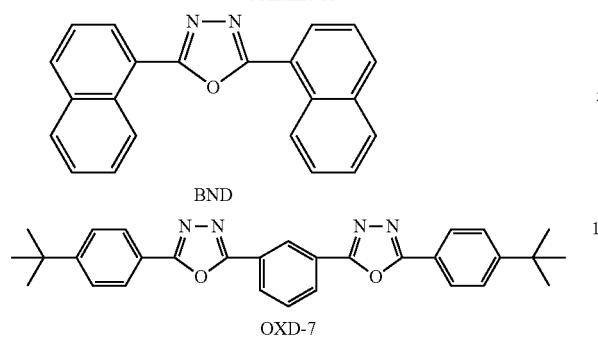

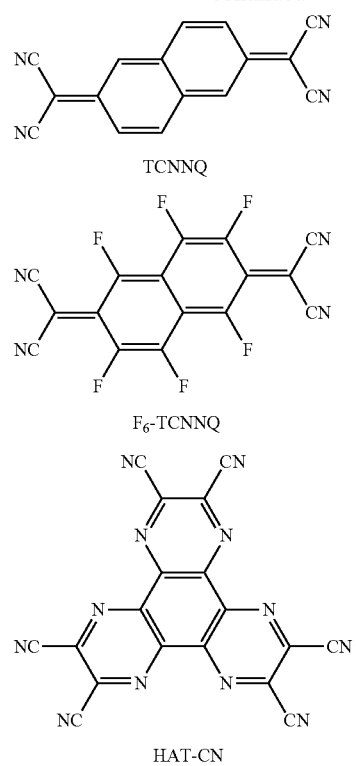

The dopant according to the present invention is a compound capable of charge transport with the organic semiconductor material. By the charge transport layer of the present invention containing a dopant, the free charge density in the charge transport layer increases, and the electrical conductivity of the charge transport layer improves to a practical level.

The dopant may be a dopant for a hole transport material and a dopant for an electron transport material.

The dopant for a hole transport material is a compound having electron affinity at the same level as or higher than the ionization potential of a hole transport organic semiconductor material. Such a dopant, which can receive electrons from a hole transport organic semiconductor material, contributes to an improvement of the electrical conductivity of the charge transport layer of the present invention.

As specific examples of the dopant for a hole transport material, organic dopants such as TCNQ, $F_4$-TCNQ, PPDN, TCNNQ, $F_6$-TCNNQ, HAT-CN, HATNA, HATNA-Cl6, HATNA-F6, $C_{60}F_{36}$, $F_{16}$-CuPc, NDP-2 (manufactured by Novaled), NDP-9 (manufactured by Novaled) and LGC-101 (manufactured by LG Chem), and inorganic dopants such as $MoO_3$, $V_2O_5$, $WO_3$, $ReO_3$ and CuI may be mentioned.

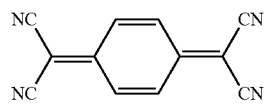

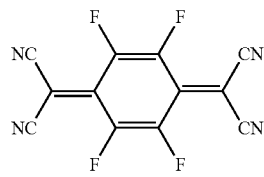

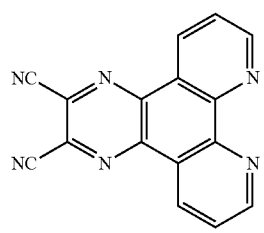

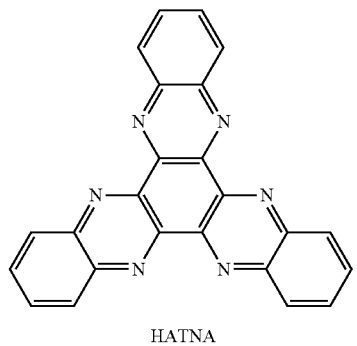

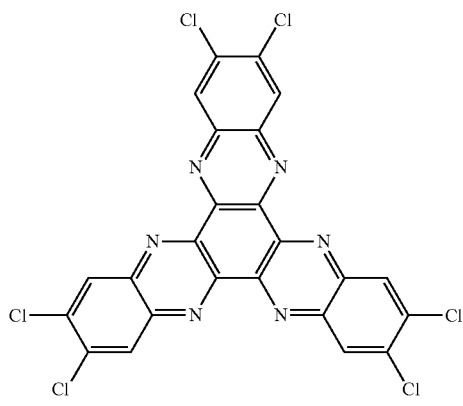

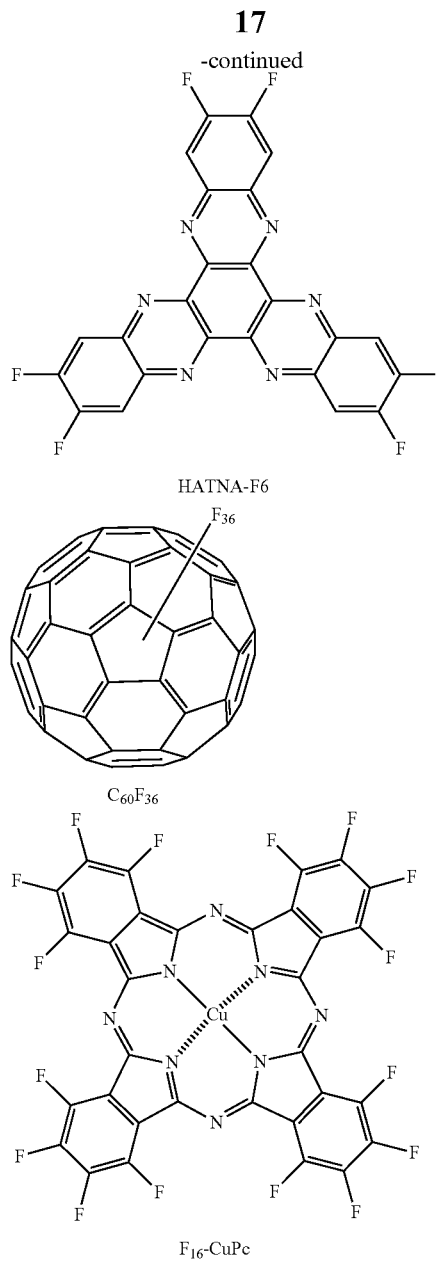

HATNA-F6

$C_{60}F_{36}$ $F_{16}$-CuPc

The dopant for an electron transport material is a compound having ionization potential at the same level as or smaller than electrical affinity of an electron transport organic semiconductor material. Such a dopant, which can pass electrons to an electron transport organic semiconductor material, contributes to an improvement of the electrical conductivity of the charge transport layer of the present invention.

As specific examples of the dopant for an electron transport material, organic dopants such as TTN and BEDT-TTF, organic dopants and organic metal complex dopants such as $CoCp_2$, $[Ru(terpy)_2]^0$, NDN-1 (manufactured by Novaled) and NDN-26 (manufactured by Novaled) and inorganic dopants such as Li, Cs, LiF, $Li_2CO_3$ and $Cs_2CO_3$ may be mentioned.

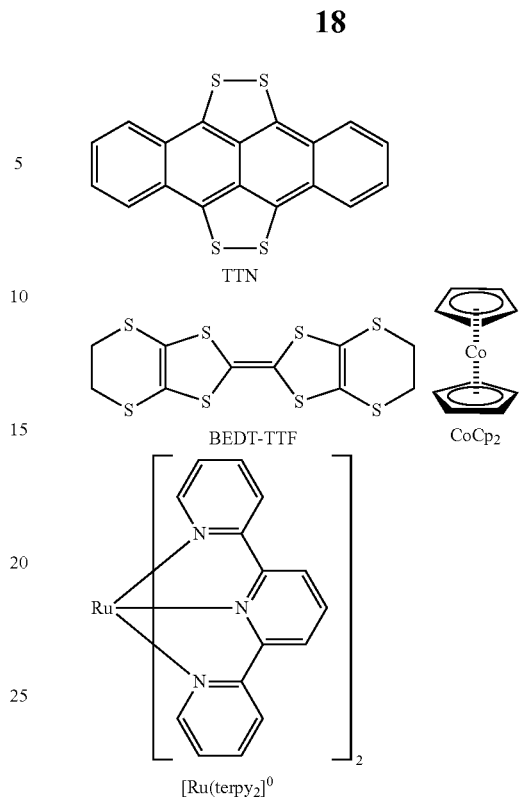

TTN

BEDT-TTF    $CoCp_2$ $[Ru(terpy)_2]^0$

The composition of the present invention may contain, in addition to the fluorinated polymer, the organic semiconductor material and the dopant, other material, however, it preferably contains only the fluorinated polymer, the organic semiconductor material and the dopant.

The fluorinated polymer may be used alone or in combination of two or more. Further, the organic semiconductor material may be used alone or in combination of two or more. Further, the dopant may be used alone or in combination of two or more.

The composition of the present invention preferably has electrical characteristics at the same level as those of a composition comprising only the organic semiconductor material and the dopant, whereby no significant change of the circuit design around the periphery of the element will be required. Specifically, J-V characteristics measured with respect to a composition comprising only the two components the organic semiconductor material and the dopant, and J-V characteristics measured in a state of the composition of the present invention are preferably at the same level. More specifically, in the J-V characteristics, at an electric potential gradient of 0.5 MV/cm, the current value measured in a state of the composition is preferably at least 20%, more preferably at least 50% of the current value measured with respect to a composition comprising only the two components the organic semiconductor material and the dopant. The upper limit of the current value ratio is not particularly limited but is preferably at most 500%. Further, the conductivity calculated from the current within an electric field strength of from $1\times10^4$ to $10^5$V/cm is preferably at least $1\times10^{-11}$ [S/cm], more preferably at least $1\times10^{-19}$ [S/cm], particularly preferably at least $1\times10^{-9}$ [S/cm].

Even though the fluorinated polymer which is an insulating material having a volume resistivity at 25° C. in the air of at least $10^{17}$Ω·cm is used, the composition of the present invention has electrical characteristics at the same level as those of the organic semiconductor material and also has a low refractive index, whereby the light-extraction efficiency of an organic photoelectronic element can remarkably be improved.

In the composition of the present invention, the proportion of the fluorinated polymer is preferably from 30 to 70 vol % to the total amount of the fluorinated polymer, the organic semiconductor material and the dopant.

Further, the lower limit value of the proportion of the fluorinated polymer is more preferably 35 vol %, particularly preferably 40 vol %. Further, the upper limit value of the proportion of the fluorinated polymer is more preferably 65 vol %, particularly preferably 60 vol %.

When the proportion of the fluorinated polymer is at least the above lower limit value, the refractive index of the composition tends to be lowered to the same level as the refractive index of e.g. a glass substrate.

When the proportion of the fluorinated polymer is at most the above upper limit value, the electrical conductivity as the basic performance of the charge transport layer is likely to be maintained.

In the composition of the present invention, the proportion of the dopant is preferably from 10 to 200 parts by mole, more preferably from 15 to 150 parts by mole, particularly preferably from 20 to 100 parts by mole per 100 parts by mole of the total amount of substance of the organic semiconductor material.

When the proportion of the dopant is at least the above lower limit value, the electrical conductivity of the composition is likely to be maintained or improved.

When the proportion of the dopant is at most the above upper limit value, the refractive index of the composition is likely to be lowered.

In the composition of the present invention according to a more preferred embodiment, the proportion of the fluorinated polymer is from 30 to 70 vol % to the total amount of the fluorinated polymer, the organic semiconductor material and the dopant, and the proportion of the dopant is from 10 to 200 parts by mole per 100 parts by mole of the total amount of substance of the organic semiconductor material.

In the composition of the present invention according to a further preferred embodiment, the proportion of the fluorinated polymer is from 35 to 65 vol % to the total amount of the fluorinated polymer, the organic semiconductor material and the dopant, and the proportion of the dopant is from 15 to 150 parts by mole per 100 parts by mole of the total amount of substance of the organic semiconductor material.

In the composition of the present invention according to a particularly preferred embodiment, the proportion of the fluorinated polymer is from 40 to 60 vol % to the total amount of the fluorinated polymer, the organic semiconductor material and the dopant, and the proportion of the dopant is from 20 to 100 parts by mole per 100 parts by mole of the total amount of substance of the organic semiconductor material.

The surface roughness of the layer containing the composition of the present invention is preferably at most 1.0 nm, more preferably at most 0.8 nm, further preferably at most 0.6 nm as represented by RMS.

In the present invention, the "surface roughness (unit: nm)" is a value measured in accordance with JIS B 0601 by e.g. an atomic force microscope (AFM) and is represented by RMS (root mean square).

When the surface roughness is at most 1.0 nm, local application of a significant electric field can be avoided when a strong electric field is applied to the layer such as the charge transport layer, and a current can be applied uniformly in the plane. When an organic photoelectronic element comprising such a layer is driven, charge transport at the respective interfaces with the adjacent electrode, emissive layer, charge transport layer, etc. will be smoothly conducted, and leak current, device defects and a decrease of electricity efficiency by an increase of the contact resistance are reduced, and the organic photoelectronic element is excellent in the performance such as the driving stability and the life.

Further, the lower limit value of the preferred surface roughness is theoretically 0 nm.

The thickness of the layer containing the composition of the present invention is not particularly limited, and is preferably from 10 nm to 250 nm, more preferably from 20 nm to 150 nm.

The composition of the present invention has an absorption coefficient in a wavelength range of from 450 nm to 800 nm of preferably at most 5,000 cm$^{-1}$, more preferably at most 1,000 cm$^{-1}$, and it particularly preferably has no absorption band in the above wavelength range. If the absorption coefficient exceeds 5,000 cm$^{-1}$, when light passes once through a layer containing the composition having a thickness of 100 nm, 5% of light is absorbed based on the total amount of light before passage being 100%. In the interior of an organic EL device, by multiple interference of light, loss by light absorption when the light passes through the layer accumulates, and thus light absorption at the time of passage through the layer may remarkably reduce the light-extraction efficiency. To use a layer having sufficiently small light absorption is very important so as not to impair the luminous efficiency of an organic EL device. The luminous efficiency of an organic EL device will not be impaired, whereby the energy utilization efficiency will be high, and further, heat release by light absorption will be suppressed and as a result, the element life will be prolonged.

In the present invention, the "absorption coefficient (unit: cm$^{-1}$)" is a value measured in accordance with JIS K 0115.

The composition of the present invention has a refractive index in a wavelength range of from 450 nm to 800 nm of preferably at most 1.60, more preferably at most 1.55. When the refractive index is at most 1.60, the refractive index of the composition of the present invention will be lowered to the same level as the refractive index of e.g. the glass substrate, and occurrence of total reflection at the boundary surface between the layer such as the charge transport layer and the glass substrate or the like is reduced, whereby the light-extraction efficiency of the organic EL device will improve. On the other hand, the theoretical lower limit value of the refractive index of the composition of the present invention is 1.0.

The layer containing the composition of the present invention may be produced by a known method, either by a dry coating method or a wet coating method, and a dry coating method is preferred, whereby the fluorinated polymer, the organic semiconductor material and the dopant can easily be formed into a film with a uniform mixing ratio. The wet coating method may, for example, be ink jet method, cast coating method, dip coating method, bar coating method, blade coating method, roll coating method, gravure coating method, flexographic coating method or spray coating method. The dry coating method may, for example, be resistance heating deposition method, electron beam deposition method or sputtering method. Among them, resistance heating deposition method is preferred, and co-deposition method by resistance heating, which makes the organic semiconductor material and the fluorinated polymer be co-deposited, is particularly preferred, whereby a film can easily be formed without decomposing the organic semiconductor and the fluorinated polymer.

The deposition rate in co-deposition (the total deposition rate of the fluorinated polymer, the organic semiconductor material and the dopant) is not particularly limited, and is preferably from 0.001 to 10 nm/s, whereby the surface roughness will be within a predetermined range.

The above-described composition of the present invention is suitably used for a layer constituting an organic photoelectronic element, such as a charge transport layer. Such a layer may, for example, be a charge injection layer or a charge transport layer, and is preferably a charge transport layer, particularly preferably a hole transport layer. That is, the composition of the present invention is preferred as a charge transport layer-forming composition.

The organic photoelectronic element of the present invention comprises a pair of anode and cathode, and at least one layer containing the composition of the present invention between the pair of electrodes. As the anode and the cathode, a known metal, metal oxide or electrically conductive polymer may be used, and they are not particularly limited.

The stereoscopic structure of the organic photoelectronic element of the present invention is not particularly limited, and may, for example, be a stereoscopic structure such that the layer containing the composition of the present invention is sandwiched between a pair of electrodes, and a current is applied in a thickness direction, or a stereoscopic structure such that an anode and a cathode are provided on different positions on a surface of the layer containing the composition of the present invention, and a current is applied in an in-plane direction.

The layer structure of the organic photoelectronic element of the present invention is not particularly limited, and the element may have, between the anode and the cathode, an optional functional layer in addition to the layer containing the composition of the present invention. For example, the organic photoelectronic element of the present invention may have a pair of electrodes consisting of a transparent electrically conductive electrode and a counter electrode facing the transparent electrically conductive electrode, and between the pair of electrodes, the layer containing the composition of the present invention and in addition, other layer such as a charge transport layer, an emissive layer or a power generation layer, sandwiched. The material constituting such an optional functional layer is not limited to an organic substance and may be an inorganic substance.

The organic photoelectronic element of the present invention may be produced, for example, by forming e.g. an anode or a cathode on a substrate and then forming the above-described layer such as a charge transport layer and the above-described optional functional layer, and then forming e.g. a cathode or an anode, but the production method is not limited thereto. The order of formation of the layer containing the composition of the present invention and the optional functional layer, and the order of laminating them, are not limited.

Formation of the layer such as a charge transport layer is similar to the above-described method for producing the layer and is particularly preferably co-deposition method by resistance heating of co-depositing the fluorinated polymer, the organic semiconductor material and the dopant.

The deposition rate in co-deposition (the total deposition rate of the fluorinated polymer, the organic semiconductor material and the dopant) is not particularly limited and is preferably from 0.001 to 10 nm/s, whereby the surface roughness of the layer is within a predetermined range.

The organic photoelectronic element of the present invention is applicable to an organic photoelectronic device such as an organic EL device, an organic transistor, a solar cell, an organic photodiode or an organic laser.

Particularly, the organic photoelectronic element of the present invention is suitably used as an organic EL device. Such an organic EL device is applicable to an organic EL device such as an organic EL display or an organic EL lighting. Such an organic EL device may be top emission type or may be bottom emission type.

The method for sandwiching the layer containing the composition of the present invention between electrodes in an organic semiconductor device such as an organic photoelectronic device or an organic EL device is not particularly limited. For example, a co-deposited film formed by co-deposition on an ITO (indium tin oxide) film-provided glass substrate may be mounted on the above device by a known method.

(Functional Effect)

As described above, the composition of the present invention comprises a fluorinated polymer, an organic semiconductor material and a dopant. The composition of the present invention having such a constitution can have a refractive index lower than the refractive index of a unitary composition consisting solely of an organic semiconductor material. Accordingly, by using a layer containing the composition of the present invention for an organic photoelectronic element, the difference between the refractive index of the layer and the refractive index of e.g. a glass substrate adjacent to the layer becomes small, and total reflection at the interface between the layer and the glass substrate is less likely to occur. Therefore, light loss by total reflection is reduced, and the light-extraction efficiency of an organic EL device improves.

On the other hand, of the layer containing the fluorinated polymer, the basic performance such as electrical conductivity may be low as compared with a layer of a unitary composition consisting solely of an organic semiconductor material. However, the layer having the constitution of the present invention, which further contains a dopant, may have electrical conductivity at the same level as or higher than a layer of a binary composition comprising an organic semiconductor and a dopant. Accordingly, the layer of the present invention has basic performance such as electrical conductivity sufficiently maintained to a practical level.

Further, the methods for producing the layer and the organic photoelectronic element of the present invention require no expensive member and are not complicated.

Therefore, according to the present invention, it is possible to provide a layer having a very low refractive index while having basic performance maintained, an organic photoelectronic element comprising such a layer, and simple methods for producing such a layer and an organic photoelectronic element.

EXAMPLES

Now, the present invention will be described in detail with reference to Examples. However, the present invention is by no means restricted to the following description.

The refractive index, the molecular weight, the intrinsic viscosity and the saturated vapor pressure of each of fluorinated copolymers prepared in Examples were measured in accordance with the following description.

Method for Measuring Refractive Index of Fluorinated Polymer

The refractive index was measured in accordance with JIS K7142.

Measurement of Mw and Mn of Fluorinated Polymer

Mw of the fluorinated polymer was measured by gel permeation chromatography (GPC). First, a polymethyl methacrylate (PMMA) standard sample having a known molecular weight was subjected to measurement by GPC, and a calibration curve was prepared from the elution time at the peak top and the molecular weight. Then, the fluorinated polymer was subjected to measurement, and Mw and Mn were obtained from the calibration curve. As a mobile phase solvent, 1,1,1,2,3,4,4,5,5,5-decafluoro-3-methoxy-2-(trifluoromethyl)pentane/hexafluoroisopropyl alcohol (85/15 by volume ratio) was used.

Measurement of Intrinsic Viscosity [η] of Fluorinated Polymer

The intrinsic viscosity [η] of the fluorinated polymer was measured by Ubbelohde viscometer (manufactured by SHIBATA SCIENTIFIC TECHNOLOGY LTD., viscometer Ubbelohde) at a measurement temperature of 30° C. using ASAHIKLIN (registered trademark) AC2000 (manufactured by Asahi Glass Company, Limited) as a solvent.

Measurement of Elastic Modulus of Fluorinated Polymer

The elastic modulus was measured by rheometer Physica MCR301 manufactured by Anton Paar. The storage modulus Pa and the loss modulus Pa were measured using as a jig PP12 (flat plate, diameter: 12 mm) with a sample thickness of 1 mm at a frequency of 1 Hz by lowering the temperature at a rate of 2° C. per minute from 200° C.

Measurement of Saturated Vapor Pressure and Evaporation Rate of Fluorinated Polymer The saturated vapor pressure and the evaporation rate at 300° C. were measured by using vacuum thermovalance VPE-9000 manufactured by ADVANCE RIKO, Inc. (former ULVAC-RIKO, Inc.).

50 mg of the fluorinated polymer was charged into a cell having an inner diameter of 7 mm and heated at a rate of 2° C. per minute at a degree of vacuum of $1 \times 10^{-3}$ Pa, whereby the evaporation rate $g/m^2 \cdot sec$ at 300° C. was measured. To calculate the saturated vapor pressure, the evaporation rate and Mw obtained by the above GPC measurement were employed.

The surface roughness, the absorption coefficient and the refractive index of the charge transport layer prepared in Examples were measured, and the J-V characteristics of an element for evaluation of electrical conductivity prepared in Examples were evaluated, in accordance with the following description.

Measurement of Surface Roughness of Charge Transport Layer

The surface of a film on a silicon substrate was observed by an AFM (manufactured by Bruker AXS, Dimension Icon) at tapping mode using a probe at a resonance frequency of 300 KHz. The area observed was 2.0 μm square, the obtained image was subjected to height correction in a direction vertical to the probe sweep direction, and then the height RMS value was calculated.

Measurement of Absorption Coefficient of Charge Transport Layer

An absorption spectrum of a film on a quartz substrate was measured by an ultraviolet visible spectrophotometer (manufactured by Shimadzu Corporation, UV-2450), and the absorption coefficient was obtained from the absorbance of the film.

Measurement of Refractive Index of Charge Transport Layer

Using a variable angle spectroscopic ellipsometer (manufactured by J. A. Woollam Co., Inc., M-2000U), measurement was conducted on a film on a silicon substrate while the angle of incidence of light was changed every 5° within a range of from 45 to 75°. At each angle, Ψ and Δ which are ellipsometry parameters were measured at intervals of about 1.6 nm within a wavelength range of from 450 nm to 800 nm. Using the above measurement data, the dielectric function of an organic semiconductor was subjected to fitting analysis by Cauchy model, and the film thickness of the charge transport layer and the refractive index of the charge transport layer to light at each wavelength were obtained.

Evaluation of Conductivity of Charge Transport Layer

By source meter (manufactured by Keithley, Keithley (registered trademark) 2401), the current flowing in the element for evaluation of electrical conductivity at each voltage was measured while a voltage was applied, taking the ITO (indium tin oxide) side as the anode and the aluminum side as the cathode. The relation between the electric field strength E obtained from the voltage and the film thickness, and the current density J obtained from the current and the element area (J-E characteristics) was obtained, and linear fitting within a range of an electric filed strength of from $10^4$ to $10^5$ V/cm was conducted to calculate the conductivity. Further, the current density at an electric field strength of $10^5$ V/cm was obtained.

Abbreviations of the monomer, solvent and polymerization initiator used for production of the fluorinated polymer are as follows.

BVE: perfluoro(3-butenyl vinyl ether)
BVE-4M: $CF_2=CFOCF(CF_3)CF_2CF=CF_2$
MMD: perfluoro(4-methyl-2-methylene-1,3-dioxolane)
PDD: perfluoro(2,2-dimethyl-1,3-dioxole)
TFE: tetrafluoroethylene
PPVE: perfluoro(propyl vinyl ether) ($CF_2=CFOCF_2CF_2CF_3$)
1H—PFH: 1,1,1,2,2,3,3,4,4,5,5,6,6-tridecafluorohexane
IPP: diisopropyl peroxydicarbonate Preparation of Polymer A 30 g of BVE, 30 g of 1H—PFH, 0.5 g of methanol and 0.44 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 28 g of polymer. The intrinsic viscosity [η] of the obtained polymer was 0.04 dl/g.

Then, the unstable terminal group of the obtained polymer was substituted by a —$CF_3$ group with fluorine gas by the method disclosed in JP-A-H11-152310, paragraph [0040] to obtain polymer A.

Of the obtained polymer A, the refractive index to light having a wavelength of 600 nm was 1.34, and the intrinsic viscosity [η] was 0.04 dl/g. Of the polymer A, Mw was 9,000, Mn was 6,000, Mw/Mn was 1.5, the saturated vapor pressure at 300° C. was 0.002 Pa, and the evaporation rate at 300° C. was 0.08 $g/m^2$ sec.

Preparation of Polymer B 10 g of BVE, 10 g of 1H—PFH, 0.2 g of methanol and 0.2 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 8 g of polymer. The intrinsic viscosity [η] of the obtained polymer was 0.04 dl/g.

Then, the obtained polymer was heated in an oven at 300° C., immersed in methanol and heated in an oven at 75° C. for 20 hours to substitute the unstable terminal group by a methyl ester group to obtain polymer B.

Of the obtained polymer B, the refractive index to light having a wavelength of 600 nm was 1.34, Mw was 7,800, Mn was 6,200, Mw/Mn was 1.3, the saturated vapor pressure at 300° C. was 0.003 Pa, and the evaporation rate at 300° C. was 0.06 g/m² sec.

Preparation of Polymer C 20 g of BVE, 20 g of 1H—PFH, 0.1 g of methanol and 0.3 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 16 g of polymer. The intrinsic viscosity [η] of the obtained polymer was 0.07 dl/g.

Then, the obtained polymer was heated in an oven at 300° C., immersed in methanol and heated in an oven at 75° C. for 20 hours to substitute the unstable terminal group by a methyl ester group to obtain polymer C.

Of the obtained polymer C, the refractive index to light having a wavelength of 600 nm was 1.34, Mw was 14,000, Mn was 10,100, Mw/Mn was 1.4, the saturated vapor pressure at 300° C. was 0.001 Pa, and the evaporation rate at 300° C. was 0.03 g/m² sec.

Preparation of Polymer D 450 g of BVE, 600 g of deionized water, 52 g of methanol as a chain transfer agent and 1 g of IPP were put in a glass-lined reactor having an internal capacity of 1 L. The system in the reactor was replaced with nitrogen, and suspension polymerization was carried out at 40° C. for 20 hours and at 50° C. for 6 hours to obtain polymer. Particles of the obtained polymer were recovered by filtration, washed with methanol and water, and dried at 100° C. to obtain 420 g of polymer having terminal groups resulting from BVE and methanol. The intrinsic viscosity [η] of the obtained polymer was 0.24 dl/g.

Then, the unstable terminal group of the obtained polymer was substituted by a —$CF_3$ group with fluorine gas by the method disclosed in JP-A-H11-152310, paragraph [0040] to obtain polymer D.

Of the obtained polymer D, the refractive index to light having a wavelength of 600 nm was 1.34, and the intrinsic viscosity [η] was 0.24 dl/g. Of the polymer D, Mw was 73,000, Mn was 48,000, Mw/Mn was 1.5, the saturated vapor pressure at 300° C. was 0.0001 Pa, and the evaporation rate at 300° C. was 0.004 g/m² sec.

Preparation of Polymer E 3 g of MMD, 9 g of 1H—PFH, 0.5 g of methanol and 0.3 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 2 g of polymer.

Then, the obtained polymer was heated in an oven at 300° C., immersed in methanol and heated in an oven at 75° C. for 20 hours to substitute the unstable terminal group by a methyl ester group to obtain polymer E.

Of the obtained polymer E, the refractive index to light having a wavelength of 600 nm was 1.33, Mw was 9,800, Mn was 8,100, Mw/Mn was 1.2, the saturated vapor pressure at 300° C. was 0.008 Pa, and the evaporation rate at 300° C. was 0.14 g/m² sec.

Preparation of Polymer F 2 g of MMD, 6 g of 1H—PFH, 0.4 g of methanol and 0.2 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 1 g of polymer.

Then, the obtained polymer was heated in an oven at 300° C., immersed in methanol and heated in an oven at 75° C. for 20 hours to substitute the unstable terminal group by a methyl ester group to obtain polymer F.

Of the obtained polymer F, the refractive index to light having a wavelength of 600 nm was 1.33, Mw was 11,300, Mn was 9,300, Mw/Mn was 1.2, the saturated vapor pressure at 300° C. was 0.007 Pa, and the evaporation rate at 300° C. was 0.10 g/m² sec.

Preparation of Polymer G 2 g of BVE-4M, 5 g of 1H—PFH, 0.1 g of methanol and 0.03 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 1 g of polymer.

Then, the obtained polymer was heated in an oven at 300° C., immersed in methanol and heated in an oven at 75° C. for 20 hours to substitute the unstable terminal group by a methyl ester group to obtain polymer G.

Of the obtained polymer G, the refractive index to light having a wavelength of 600 nm was 1.34, Mw was 10,100, Mn was 8,600, Mw/Mn was 1.2, the saturated vapor pressure at 300° C. was 0.002 Pa, and the evaporation rate at 300° C. was 0.04 g/m² sec.

Preparation of Polymer H 10 g of BVE-4M, 6 g of 1H—PFH, 0.6 g of methanol and 0.13 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 2 g of polymer.

Then, the obtained polymer was heated in an oven at 260° C., immersed in methanol and heated in an oven at 75° C. for 20 hours to substitute the unstable terminal group by a methyl ester group to obtain polymer H.

Of the obtained polymer H, the refractive index to light having a wavelength of 600 nm was 1.34, Mw was 4,500, Mn was 4,000, Mw/Mn was 1.2, the saturated vapor pressure at 300° C. was 0.01 Pa, and the evaporation rate at 300° C. was 0.2 g/m² sec.

Preparation of Polymer I 1.5 g of BVE, 2 g of PDD, 10 g of 1H—PFH, 0.3 g of methanol and 0.4 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 2 g of polymer.

The obtained polymer had a composition of BVE units: PDD units=24:76 (mol %).

Then, the obtained polymer was heated in an oven at 300° C., immersed in methanol and heated in an oven at 75° C. for 20 hours, and the unstable terminal group was substituted by a methyl ester group to obtain polymer I. Of the polymer I, the refractive index to light having a wavelength of 600 nm was 1.30, Mw was 9,200, Mn was 8,100, Mw/Mn was 1.1, the saturated vapor pressure at 300° C. was 0.003 Pa, and the evaporation rate at 300° C. was 0.06 g/m² sec.

Preparation of Polymer J 1.1 g of BVE, 1.5 g of PDD, 7 g of 1H—PFH, 0.1 g of methanol and 0.3 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 1 g of polymer.

The obtained polymer had a composition of BVE units: PDD units=24:76 (mol %).

Then, the obtained polymer was heated in an oven at 300° C., immersed in methanol and heated in an oven at 75° C. for 20 hours, and the unstable terminal group was substituted by a methyl ester group to obtain polymer J. Of the polymer J, the refractive index to light having a wavelength of 600 nm was 1.30, Mw was 14,100, Mn was 10,700, Mw/Mn was 1.3, the saturated vapor pressure at 300° C. was 0.001 Pa, and the evaporation rate at 300° C. was 0.03 g/m² sec.

Preparation of Polymer K

Into an stainless steel autoclave having an internal capacity of 1,006 mL, 153 g of PPVE, 805 g of 1H—PFH, 2.4 g of methanol and 1.1 g of 2,2'-azobis(isobutyronitrile) were charged, followed by freeze deaeration with liquid nitrogen. The temperature was increased to 70° C., and TFE was introduced up to 0.57 MPaG. While the temperature and the pressure were kept constant, TFE was continuously supplied to conduct polymerization. 9 hours after initiation of the polymerization, the autoclave was cooled to terminate the polymerization reaction, the gas in the system was purged to obtain a solution of polymer.

813 g of methanol was added and mixed to the solution of polymer, and a lower layer in which the polymer was dispersed was recovered. The obtained dispersion of polymer was dried by warm air at 80° C. for 16 hours and then vacuum dried at 100° C. for 16 hours to obtain 19 g of polymer.

The obtained polymer had a composition of PPVE units: TFE units=14:86 (mol %).

Then, the obtained polymer was heated in an oven at 300° C., immersed in methanol and heated in an oven at 75° C. for 20 hours, and the unstable terminal group was substituted by a methyl ester group to obtain polymer K. Since Mw and Mn of the polymer K cannot be measured by the above method, instead, the relation between the modulus and the temperature of the polymer K is shown in FIG. 10.

Of the obtained polymer K, the refractive index to light having a wavelength of 600 nm was 1.34, and the evaporation rate at 300° C. was 0.04 g/m² sec.

Examples 1 to 6

<<Preparation of Charge Transport Layer>>

Two silicon substrates and one quartz substrate cut into an about 2 cm square were respectively subjected to ultrasonic cleaning with a neutral detergent, acetone and isopropanol, and further cleaned by boiling in isopropanol, and then subjected to ozone treatment to remove substances attached to the surface of the substrates. These substrates were respectively placed in a vacuum deposition apparatus, which was evacuated of air to a pressure of at most $10^{-4}$ Pa, and polymer A, m-MTDATA (organic semiconductor material) and HAT-CN (dopant) were co-deposited so that the composition of the charge transport layer would be the composition as identified in Table 1 by resistance heating in the vacuum deposition apparatus to prepare a charge transport layer having a thickness of about 100 nm on each of the substrates. The total deposition rate of the three materials was 0.2 nm/s. The results of measurement of the surface roughness of the charge transport layer and the results of measurement of the refractive index to light having a wavelength of 600 nm are shown in Table 1.

<<Preparation of Element for Evaluation of Electrical Conductivity>>

As a substrate to prepare an element, a glass substrate having an ITO (indium tin oxide) film formed in a 2 mm width strip was used. The substrate was subjected to ultrasonic cleaning with a neutral detergent, acetone and isopropanol and further cleaned by boiling in isopropanol, and then subjected to ozone treatment to remove substances attached to the ITO film surface. The substrate was placed in a vacuum deposition apparatus, which was evacuated of air to a pressure of at most $10^{-4}$ Pa, and polymer A, m-MTDATA (organic semiconductor material) and HAT-CN (dopant) were co-deposited so that the composition of the charge transport layer would be the composition as identified in Table 1 by resistance heating in the vacuum deposition apparatus to form a charge transport layer having a thickness of about 100 nm. The total deposition rate of the three materials was 0.2 nm/s. Further, aluminum was deposited by resistance heating in a 2 mm width strip to obtain an element for evaluation of electrical conductivity. The element area is 2 mm×2 mm at which the 2 mm width ITO and the 2 mm width aluminum intersect with each other. The results of evaluation of electrical conductivity of the charge transport layer are shown in Table 1. In the column "conductivity", "E" represents the power. For example, "4.1E-07" represents "$4.1 \times 10^{-7}$".

Examples 7 to 12

A charge transport layer and an element for evaluation of electrical conductivity were prepared in the same manner as in Examples 1 to 6 by using Teflon (registered trademark) AF1600 (manufactured by Chemours (former DuPont)) as the fluorinated polymer, m-MTDATA (organic semiconductor material) and HAT-CN (dopant) so that the composition of the charge transport layer would be the composition as identified in Table 1. The refractive index of Teflon (registered trademark) AF1600 to light having a wavelength of 600 nm was 1.32. The saturated vapor pressure of Teflon (registered trademark) AF1600 at 300° C. was 0.0001 Pa. The intrinsic viscosity [η] of Teflon (registered trademark) AF1600 was 0.88 dl/g.

Of the obtained charge transport layer, the results of measurement of the surface roughness, the results of measurement of the refractive index to light having a wavelength of 600 nm, and the results of evaluation of the electrical conductivity are shown in Table 1.

Examples 13 to 22

A charge transport layer and an element for evaluation of electrical conductivity were prepared in the same manner as in Example 2 except that the polymers B to K were used instead of the polymer A.

Of the obtained charge transport layer, the result of measurement of the refractive index to light having a wavelength of 600 nm and the results of evaluation of electrical conductivity are shown in Table 1.

Examples 23 to 27

A charge transport layer and an element for evaluation of electrical conductivity were prepared in the same manner as in Example 2 except that the organic semiconductor, the dopant or their combination was changed. The organic semiconductor and the dopant used are shown in Table 1.

Of the obtained charge transport layer, the results of measurement of the refractive index to light having a wavelength of 600 nm and the results of evaluation of the electrical conductivity are shown in Table 1.

Comparative Examples 1 to 5

A charge transport layer and an element for evaluation of electrical conductivity were prepared in the same manner as in Examples 1 to 6 except that without using a fluorinated polymer, m-MTDATA (organic semiconductor material) and HAT-CN (dopant) were deposited on a substrate so that the composition of the charge transport layer would be the composition as identified in Table 2.

Of the obtained charge transport layer, the results of measurement of the surface roughness, the results of measurement of the refractive index to light having a wavelength of 600 nm, and the results of evaluation of the electrical conductivity are shown in Table 2.

Comparative Examples 6 to 10

A charge transport layer and an element for evaluation of electrical conductivity were prepared in the same manner as in Comparative Example 3 except that the organic semiconductor, the dopant or their combination was changed. The organic semiconductor and the dopant used are shown in Table 2.

Of the obtained charge transport layer, the results of measurement of the refractive index to light having a wavelength of 600 nm and the results of evaluation of electrical conductivity are shown in Table 2.

TABLE 1

| | Physical properties of fluorinated polymer | | | Organic | | Composition of charge transport layer | |
| | | | | | | Fluorinated polymer | Proportion of dopant to organic semiconductor |
| | Type of polymer | Mw | Mw/Mn | semiconductor | Dopant | [vol %] | [parts by mole] |
|---|---|---|---|---|---|---|---|
| Example 1 | Polymer A | 9000 | 1.3 | m-MTDATA | HAT-CN | 30 | 50 |
| Example 2 | ↑ | ↑ | ↑ | ↑ | ↑ | 50 | 50 |
| Example 3 | ↑ | ↑ | ↑ | ↑ | ↑ | 50 | 100 |
| Example 4 | ↑ | ↑ | ↑ | ↑ | ↑ | 50 | 200 |
| Example 5 | ↑ | ↑ | ↑ | ↑ | ↑ | 50 | 10 |
| Example 6 | ↑ | ↑ | ↑ | ↑ | ↑ | 70 | 50 |
| Example 7 | AF1600 | 379000 | 1.6 | ↑ | ↑ | 30 | 50 |
| Example 8 | ↑ | ↑ | ↑ | ↑ | ↑ | 50 | 50 |
| Example 9 | ↑ | ↑ | ↑ | ↑ | ↑ | 50 | 100 |
| Example 10 | ↑ | ↑ | ↑ | ↑ | ↑ | 50 | 200 |
| Example 11 | ↑ | ↑ | ↑ | ↑ | ↑ | 50 | 10 |
| Example 12 | ↑ | ↑ | ↑ | ↑ | ↑ | 70 | 50 |
| Example 13 | Polymer B | 7800 | 1.3 | ↑ | ↑ | 50 | 50 |
| Example 14 | Polymer C | 14000 | 1.4 | ↑ | ↑ | 50 | 50 |
| Example 15 | Polymer D | 73000 | 1.5 | ↑ | ↑ | 50 | 50 |
| Example 16 | Polymer E | 9800 | 1.2 | ↑ | ↑ | 50 | 50 |
| Example 17 | Polymer F | 11300 | 1.2 | ↑ | ↑ | 50 | 50 |
| Example 18 | Polymer G | 10100 | 1.2 | ↑ | ↑ | 50 | 50 |
| Example 19 | Polymer H | 4500 | 1.2 | ↑ | ↑ | 50 | 50 |
| Example 20 | Polymer I | 9200 | 1.1 | ↑ | ↑ | 50 | 50 |
| Example 21 | Polymer J | 14100 | 1.3 | ↑ | ↑ | 50 | 50 |
| Example 22 | Polymer K | — | — | ↑ | ↑ | 50 | 50 |
| Example 23 | Polymer A | 9000 | 1.3 | ↑ | F4-TCNQ | 50 | 50 |
| Example 24 | ↑ | ↑ | ↑ | HT211 | ↑ | 50 | 50 |
| Example 25 | ↑ | ↑ | ↑ | α-NPD | ↑ | 50 | 50 |
| Example 26 | ↑ | ↑ | ↑ | ↑ | HAT-CN | 50 | 50 |
| Example 27 | ↑ | ↑ | ↑ | HT211 | ↑ | 50 | 50 |

| | Surface roughness of charge transport layer [nm] | Evaluation of electrical conductivity of charge transport layer | | Refractive index of charge transport layer |
| | | Conductivity [S/cm] | Current density [mA/cm$^2$] | |
|---|---|---|---|---|
| Example 1 | 0.56 | 4.1E−07 | 44 | 1.64 |
| Example 2 | 0.21 | 7.9E−08 | 10 | 1.55 |
| Example 3 | 0.39 | 3.6E−08 | 4.4 | 1.54 |
| Example 4 | 0.41 | 4.6E−08 | 6.2 | 1.56 |
| Example 5 | 1.02 | 2.3E−09 | 1.8 | 1.53 |
| Example 6 | 0.59 | 1.8E−08 | 4 | 1.45 |
| Example 7 | 1.02 | 1.2E−07 | 15.2 | 1.62 |
| Example 8 | 1.62 | 6.6E−08 | 10 | 1.53 |
| Example 9 | 1.4 | 3.0E−08 | 4 | 1.53 |
| Example 10 | 1.31 | 1.5E−08 | 1.8 | 1.54 |
| Example 11 | 1.65 | 8.4E−10 | 0.45 | 1.54 |

TABLE 1-continued

| | | | | |
|---|---|---|---|---|
| Example 12 | 1.22 | 3.5E−11 | 0.01 | 1.43 |
| Example 13 | — | 3.6E−08 | 2.8 | 1.55 |
| Example 14 | — | 2.4E−09 | 0.20 | 1.55 |
| Example 15 | — | 9.0E−08 | 0.01 | 1.55 |
| Example 16 | — | 3.0E−09 | 0.25 | 1.54 |
| Example 17 | — | 3.2E−09 | 0.30 | 1.54 |
| Example 18 | — | 4.0E−07 | 38.8 | 1.55 |
| Example 19 | — | 8.2E−08 | 6.6 | 1.55 |
| Example 20 | — | 7.8E−10 | 0.06 | 1.53 |
| Example 21 | — | 1.6E−09 | 0.14 | 1.53 |
| Example 22 | — | 3.1E−07 | 27.4 | 1.55 |
| Example 23 | — | 8.1E−08 | 7.1 | 1.55 |
| Example 24 | — | 9.5E−07 | 84.6 | 1.54 |
| Example 25 | — | 7.6E−08 | 6.6 | 1.59 |
| Example 26 | — | 7.3E−08 | 8.0 | 1.59 |
| Example 27 | — | 9.1E−07 | 127.4 | 1.57 |

TABLE 2

| | Physical properties of fluorinated polymer | | | | | Composition of charge transport layer | |
|---|---|---|---|---|---|---|---|
| | Type of polymer | Mw | Mw/Mn | Organic semiconductor | Dopant | Fluorinated polymer [vol %] | Proportion of dopant to organic semiconductor [parts by mole] |
| Comparative Example 1 | — | — | — | m-MTDATA | HAT-CN | — | 0 |
| Comparative Example 2 | — | — | — | ↑ | ↑ | — | 10 |
| Comparative Example 3 | — | — | — | ↑ | ↑ | — | 50 |
| Comparative Example 4 | — | — | — | ↑ | ↑ | — | 100 |
| Comparative Example 5 | — | — | — | ↑ | ↑ | — | 200 |
| Comparative Example 6 | — | — | — | ↑ | F4-TCNQ | — | 50 |
| Comparative Example 7 | — | — | — | HT211 | ↑ | — | 50 |
| Comparative Example 8 | — | — | — | α-NPD | ↑ | — | 50 |
| Comparative Example 9 | — | — | — | ↑ | HAT-CN | — | 50 |
| Comparative Example 10 | — | — | — | HT211 | ↑ | — | 50 |

| | Surface roughness of charge transport layer [nm] | Evaluation of electrical conductivity of charge transport layer | | Refractive index of charge transport layer |
|---|---|---|---|---|
| | | Conductivity [S/cm] | Current density [mA/cm$^2$] | |
| Comparative Example 1 | 0.23 | — | 3.40E−04 | 1.75 |
| Comparative Example 2 | 0.63 | 1.4E−08 | 7.2 | 1.76 |
| Comparative Example 3 | 0.39 | 2.0E−07 | 21 | 1.78 |
| Comparative Example 4 | 0.28 | 1.8E−07 | 25 | 1.80 |
| Comparative Example 5 | 0.41 | 1.4E−07 | 13 | 1.82 |
| Comparative Example 6 | — | 2.1E−07 | 18.0 | 1.77 |
| Comparative Example 7 | — | 2.4E−06 | 218.9 | 1.76 |
| Comparative Example 8 | — | 1.9E−07 | 17.7 | 1.80 |

TABLE 2-continued

| | | | | |
|---|---|---|---|---|
| Comparative Example 9 | — | 1.8E−07 | 21.3 | 1.81 |
| Comparative Example 10 | — | 2.3E−06 | 278.8 | 1.77 |

<<Measurement Results and Evaluation>>

As evident from Table 1, it was confirmed that the surface roughness of the charge transport layer in each of Examples 7 to 12 in which Teflon (registered trademark) AF1600 was mixed, was increased as compared with the surface roughness of the charge transport layer in each of Examples 1 to 6 in which the polymer A was mixed. The increase of the surface roughness is considered to be derived from the thermally decomposed product or crystallinity of the deposited film of Teflon (registered trademark) AF1600.

Whereas the refractive index of the charge transport layer in each of Examples 1 to 6, Examples 7 to 12, Examples 13 to 27 and Comparative Examples 1 to 10 was as identified in Tables 1 and 2. The difference in the refractive index is considered to reflect the refractive index of the fluorinated polymer itself blended or the proportion of the fluorinated polymer. It was confirmed that the refractive index of the charge transport layer in each of Examples 1 to 27 in which the fluorinated polymer was mixed was lower than the refractive index of the charge transport layer in each of Comparative Examples 1 to 10 in which no fluorinated polymer was contained.

The absorption coefficient of the charge transport layer in each of Examples 1 to 27 and Comparative Examples 1 to 10 at a wavelength of from 450 nm to 800 nm was at most 5,000 $cm^{-1}$. It was confirmed that each charge transport layer had high transparency in a visible region, and had light transmission property at the same level as a unitary charge transport layer consisting solely of the organic semiconductor in Comparative Example 1.

The electrical conductivity of the charge transport layer in each of Examples 1 to 27 and Comparative Examples 1 to 10 was as identified in Tables 1 and 2. The electrical conductivity of the charge transport layer in each of Examples 1 to 27 was at the same level as the electrical conductivity of the charge transport layer containing no fluorinated polymer in each of Comparative Examples 1 to 10, and its basic performance of the charge transport layer in each of Examples 1 to 27 was practically usable.

As described above, the charge transport layer in each of Examples of the present invention was confirmed to have a low refractive index necessary to improve the light-extraction efficiency of an organic EL device while having its basic performance maintained.

INDUSTRIAL APPLICABILITY

The composition of the present invention can be suitably used for an operation panel or an information display panel of various electronic equipment as an organic EL device and in addition, suitably used also for an organic photoelectronic device, the refractive index of which influences the device characteristics.

Further, the composition of the present invention is suitably used to form a light-receiving element excellent in light absorption property, a transistor excellent in transparency, and an organic semiconductor circuit which is so transparent as not to be visually recognized on a glass substrate.

This application is a continuation of PCT Application No. PCT/JP2018/003835, filed on Feb. 5, 2018, which is based upon and claims the benefit of priority from Japanese Patent Application No. 2017-021388 filed on Feb. 8, 2017 and Japanese Patent Application No. 2017-161637 filed on Aug. 24, 2017. The contents of those applications are incorporated herein by reference in their entireties.

What is claimed is:

1. A composition comprising a fluorinated polymer, an organic semiconductor material and a dopant, wherein the fluorinated polymer has a saturated vapor pressure at 300° C. of at least 0.001 Pa.

2. The composition according to claim 1, wherein the fluorinated polymer has a refractive index in a wavelength range of from 450 nm to 800 nm of at most 1.5.

3. The composition according to claim 1, wherein the fluorinated polymer is a fluorinated polymer having an alicyclic ring in its main chain.

4. The composition according to claim 1, wherein the fluorinated polymer has a mass average molecular weight of from 1,500 to 50,000.

5. The composition according to claim 1, wherein the proportion of the fluorinated polymer is from 30 to 70 vol % to the total amount of the fluorinated polymer, the organic semiconductor material and the dopant.

6. The composition according to claim 1, wherein the proportion of the dopant is from 10 to 200 parts by mole per 100 parts by mole of the total amount of substance of the organic semiconductor material.

7. The composition according to claim 1, which has a surface roughness of at most 1.0 nm by RMS.

8. The composition according to claim 1, which has an absorption coefficient in a wavelength range of from 450 nm to 800 nm of at most 5,000 $cm^{-1}$.

9. The composition according to claim 1, which has a refractive index in a wavelength range of from 450 nm to 800 nm of at most 1.60.

10. An organic photoelectronic element having a layer comprising the composition as defined in claim 1.

11. The organic photoelectronic element according to claim 10, wherein the organic photoelectronic element is an organic EL device.

12. A method for producing a layer comprising the composition as defined in claim 1, which comprises co-depositing the fluorinated polymer, the organic semiconductor material and the dopant on a substrate.

13. A method for producing the organic photoelectronic element as defined in claim 10, which comprises co-depositing the fluorinated polymer, the organic semiconductor material and the dopant on a substrate.

* * * * *

UNITED STATES PATENT AND TRADEMARK OFFICE
CERTIFICATE OF CORRECTION

| | |
|---|---|
| PATENT NO. | : 11,469,377 B2 |
| APPLICATION NO. | : 16/449574 |
| DATED | : October 11, 2022 |
| INVENTOR(S) | : Daisuke Yokoyama et al. |

It is certified that error appears in the above-identified patent and that said Letters Patent is hereby corrected as shown below:

On the Title Page

Item (63), the Related U.S. Application Data has been omitted. Item (63) should read:
-- Related U.S. Application Data
(63) Continuation of Application No. PCT/JP2018/003835,
filed on February 5, 2018 --

Signed and Sealed this
Twenty-eighth Day of February, 2023

Katherine Kelly Vidal
*Director of the United States Patent and Trademark Office*